United States Patent
Choudhury et al.

(10) Patent No.: US 7,105,924 B2
(45) Date of Patent: Sep. 12, 2006

(54) INTEGRATED CIRCUIT HOUSING

(75) Inventors: Debabani Choudhury, Thousand Oaks, CA (US); Ross Bowen, West Hills, CA (US); James Foschaar, Thousand Oaks, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/716,196

(22) Filed: Nov. 17, 2003

(65) Prior Publication Data

US 2005/0082652 A1    Apr. 21, 2005

Related U.S. Application Data

(60) Provisional application No. 60/512,014, filed on Oct. 15, 2003.

(51) Int. Cl.
*H01L 23/34* (2006.01)

(52) U.S. Cl. .................... 257/728; 257/678; 438/106; 438/121

(58) Field of Classification Search ............... 257/728, 257/678, 680, 688, 730; 438/106, 121
See application file for complete search history.

(56) References Cited

U.S. PATENT DOCUMENTS

| | | | |
|---|---|---|---|
| 6,049,127 A * | 4/2000 | Yoo et al. ................. 257/728 |
| 6,140,698 A * | 10/2000 | Damphousse et al. ...... 257/704 |
| 6,603,193 B1 * | 8/2003 | Crane et al. ............... 257/659 |
| 6,670,222 B1 * | 12/2003 | Brodsky .................... 438/118 |
| 6,713,865 B1 * | 3/2004 | Nomura .................... 257/712 |
| 2001/0004129 A1 * | 6/2001 | Tsukiyama et al. ........ 257/684 |

* cited by examiner

Primary Examiner—Douglas W. Owens
(74) Attorney, Agent, or Firm—Ladas & Parry LLP

(57) ABSTRACT

A housing for an integrated circuit, comprising a base for securing a substrate with an integrated circuit thereon, a top cover, and a body with a cavity for receiving the substrate and at least a portion of the top cover therein to form an enclosed housing therewith, the body including at least one connector extending from within the cavity to outside of the body and configured to contact the integrated circuit when the substrate is in the cavity.

20 Claims, 4 Drawing Sheets

INTEGRATED CIRCUIT HOUSING

RELATED APPLICATIONS

This patent application claims the priority of U.S. provisional patent application Ser. No. 60/512,014, filed on Oct. 15, 2003, the entire content of which is hereby incorporated by reference thereto.

TECHNICAL FIELD

This disclosure relates to novel designs and methods for housing high speed integrated circuits (ICs).

BACKGROUND

The integration of Monolithic Millimeter Wave Integrated Circuits (MMICs) into high frequency communication systems and devices has increased the need for a low cost packaging system that can be mass produced. These systems are currently operating at 50 GHz and above, but currently available, conventional packaging techniques are typically inadequate for such high frequency devices because they fail to adequately transmit the signal without any resonance from DC to mm-wave and thus result in a loss with every transition. Most V-band and W-band MMIC packages available today have narrow operating bandwidths and offer only single-ended inputs and outputs (I/Os).

Traditionally, integrated circuits (IC) formed on a semiconductor chip are packaged by enclosing the chip within a plastic or ceramic casing, attaching wire bonds between the pads of the chip and the package leads, and then soldering the leads to a circuit board. Ceramic packaging such as co-fired ceramic enclosures are commonly used for housing small ICs and other solid-state electronic devices. The IC is typically housed in or on a ceramic substrate, or in a cavity within the substrate, and metallized feed-throughs connect the integrated circuit with the outside of the package. The package may have a metal base or core that serves as a ground plane, and may further incorporate a metal slug for improved heat removal.

Commonly, thick film or screen printing techniques are used to form conductive traces on the substrate, and metal leads such as Kovar™ or copper ribbons are then soldered or brazed onto the metal traces to provide connections from the package to exterior circuitry. This technique is acceptable for low frequency devices but when applied to high frequency devices however, the millimeter components corresponding to the high frequency components of the signal exhibit odd behavior because the standard package cannot carry the high frequency signal. These losses and the erratic signal behavior occur as a result of the internal structure of the package and the signal transitioning from one package down to the circuit board and back up into another package. In particular, printed feed-throughs have to be matched to a transmission line, which is typically a microstrip that is printed on the circuit board, and wire bonds, ribbon bonds, or leads at this point create an inductance that can result in undesirable insertion losses at higher frequencies.

For high frequency (i.e. microwave and millimeter wave frequencies) IC packaging, controlled impedance feed-throughs and interconnections are typically provided to control signal reflections and losses to acceptable levels. This entails careful design of conductor geometry, which requires consideration of dielectric thickness and permittivity, as well as ground geometry. At high frequencies, many feed-through structures will support higher order modes of transmission and resonances, and have dispersive propagation degrading characteristics (i.e., frequency-dependent characteristic impedance and propagation velocity) thereby degrading signal fidelity. To reduce or minimize these deleterious effects, thinner dielectric substrates are preferable.

Because the traces on a well-designed microwave package are themselves controlled impedance transmission lines and the interconnect substrate can typically be a printed circuit board of appropriate material and thickness for high frequency operation, it is desirable to maintain the lead lengths between the package and the printed circuit board traces as short as possible to achieve broadband performance (typically, DC to 40 GHz or more) with low-loss interconnection. Surface-mounting the ICs, wherein all package signal and ground connections lie in the same plane, are known to address these issues. Typical surface-mount packages employ metallic vias through the dielectric (e.g. ceramic) layer to transfer both signal and ground connections from the device to the package mounting surface (typically a metal chassis), as well as carry much of the heat generated by the packaged device to the chassis.

In view of the above, there is an ongoing quest for a packaging solution that will allow the nonplanar transmission line connectors on the package to be connected to the planar line conductors on the printed circuit board with a minimum of signal loss. The packaging will preferably also simplify the installation as well as replacement of the packaged ICs within the overall system, facilitate multi-chip assembly, and be applicable to multi-port ICs. Conventional methods for assembling a module having multiple chips entail numerous, time-consuming, and mistake-riddled prototype iterations before a final design is produced. Accordingly, what is now needed is a method and design for packaging high speed ICs that offers ease of assembly and re-assembly, is low-cost to produce and use, and provides acceptable performance at high IC operating frequencies. The embodiments disclosed herein answer these and other needs.

SUMMARY

In an embodiment disclosed herein, a housing for an integrated circuit includes a base for securing a substrate with an integrated circuit thereon, a top cover, and a body with a cavity for receiving the substrate and at least a portion of the top cover therein to form an enclosed housing therewith, the body including at least one connector extending from within the cavity to outside of the body and configured to contact the integrated circuit when the substrate is in the cavity.

In another embodiment, a method for forming a housing for an integrated circuit includes providing a base for securing a substrate with an integrated circuit thereon, providing a top cover, and providing a body with a cavity for receiving the substrate and at least a portion of the top cover therein to form an enclosed housing therewith, the body including at least one connector extending from within the cavity to outside of the body and configured to contact the integrated circuit when the substrate is in the cavity.

In another embodiment, each of the base, the body, and the top cover may further include one or more openings for receiving fasteners therein to secure the base, the body, and the top cover together to form the enclosed housing. In a further embodiment, the housing may include one or more fasteners configured to be received in the openings and thereby secure the base, the body, and the top cover together. In a still further embodiment, the housing may include an integrated circuit mounted onto the base to be received in the cavity and contact the at least one connector when the base, the body, and the top cover are secured together. In yet another embodiment, the top cover may further include an absorber formed of a material that absorbs radio frequency energy and configured to be received into the cavity when the base, the body, and the top cover are secured together.

These and other features and advantages will become further apparent from the detailed description and accompanying figures that follow.

DETAILED DESCRIPTION

Figure 1:
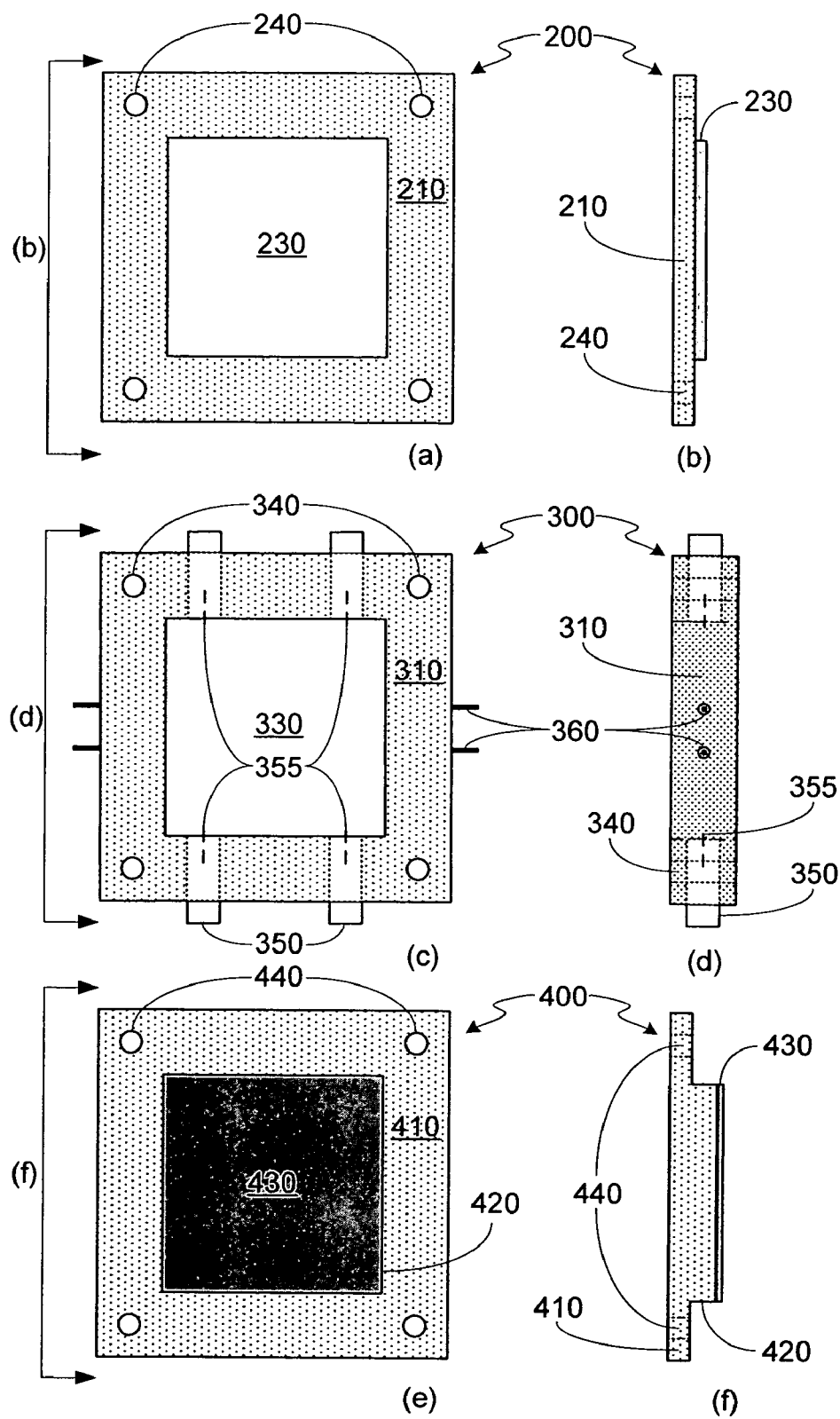
FIG. 1 is a schematic diagram showing the three component parts of an IC housing as disclosed herein.
Figure 3:
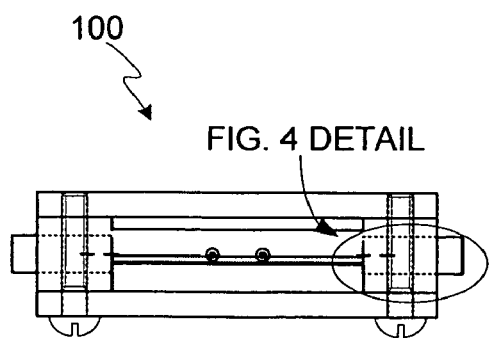
FIG. 3 is a photograph of the IC housing of FIGS. 1 and 2 in assembled form.

Referring to FIGS. 1 and 3, an IC housing or package 100 as disclosed herein is assembled from three discrete component parts, including a top cover 200, a main housing 300, and a substrate holder or base 400. Preferably, all three component parts are fabricated from a metal or metallic compound. In one embodiment, the component parts may be fabricated from a brass or copper based material, and optionally may be plated with Ni/Au to a desired thickness (e.g. 5 μm). In the embodiments described herein, the component parts 200, 300, 400 are shown formed in a generally rectangular configuration. However, it must be understood that the component parts may be formed in any geometric configuration practicable and desirable, provided that the three component parts can be assembled as described herein.

With continuing reference to FIGS. 1(e) and (f), base 400 is shown as formed with a substantially planar plate 410 and a pedestal 420 extending from a generally central position located on one of the surfaces of the plate. The plate 410 and pedestal 420 may be formed from a monolithic block of material, or may be discrete parts that are welded, brazed, glued, fastened, or adhered together by any practicable method as known to those skilled in the art. However, as will be appreciated by those skilled in the art, it is highly desirable that the interface between plate 410 and pedestal 420 exhibit maximal electrical and thermal conductivity, and for this reason it may be preferable to form the base 400 by machining from a single block, or casting as a monolithic piece. If the plate 410 and pedestal 420 are formed as separate pieces, ablestik™ and indium are among the materials that may be used to form the bond between the plate and the pedestal.

The pedestal 420 is formed with a preferably smooth surface to receive an IC substrate 430 thereon. The IC substrate 430 contains the IC to be encased within the housing 100 and is formed with solid metal or metallized vias to ground the IC to the base 400, as described elsewhere herein. The metal vias formed through the substrate 430 also act to ensure optimal heat transfer with low-cost ceramic substrates, thereby eliminating the need to use more costly substrates such AlN.

The plate 410 of the base 400 is further formed with openings 440 extending therethrough between the two surfaces of the plate and situated generally outside the periphery of the pedestal 420. Openings 440 are configured so as to align with similar openings formed in the other component parts 200, 300 to receive fasteners therethrough and detachably secure the three component parts 200, 300, 400 together to form the housing 100 of this embodiment.

With reference now to FIGS. 1(c) and (d), the main housing 300 is formed in a generally closed configuration with a wall 310 having an outer surface, generally opposed top and bottom surfaces, and an inner surface enclosing and defining a cavity 330 therein. The cavity 330 is configured to receive the pedestal 420 and the IC substrate 430 of the base 400 therein, and is configured to concurrently receive the top cover 200 therein as described in greater detail elsewhere herein. It may be found preferable to configure the base 400 and the main housing 300 so that the pedestal 420 and the IC substrate 430 are received substantially snugly within the cavity 330 of the main housing 300.

The main housing wall 310 is formed with a number of apertures through which various connectors may extend from the outside of the main housing 300 into the main housing cavity 330. In the embodiment shown, the main housing 300 includes RF connectors 350, which may be typical V-band connectors (V- or VP-connectors) having a central conductor pin 355 extending therethrough to provide an electrically conductive path between an external signal waveguide and the IC mounted on the substrate 430. In the embodiment shown, the main housing 300 further includes DC connectors 360 extending through the main housing wall 310. The type, number, and location of connectors extending through the main housing wall 310 is dependent upon the configuration of the IC to be encased within, as appreciated by those skilled in the art.

The main housing 300 is also formed with openings 340 extending through the main housing wall 310 between the top and bottom surfaces. Openings 340 are configured so as to align with the openings 440 formed in the base 400 as well as with similar openings formed in the top cover 200 to receive fasteners therethrough and detachably secure the three component parts 200, 300, 400 together to form the housing 100 of this embodiment.

Referring to FIGS. 1(a) and (b), the top cover 200 is formed with a substantially planar plate 210 that includes openings 240 extending therethrough to align with the openings 340 formed in the main housing 300 and with the openings 440 formed in the base 400 so as to receive fasteners therethrough and detachably secure the three component parts 200, 300, 400 together to form the housing 100 of this embodiment. Optionally, the top cover 200 may also include a broad bandwidth absorber 230 extending from the top cover plate 210. The absorber 230 is configured to be received into the main housing cavity 330 concurrently with the IC substrate 430, and functions to eliminate any residual cavity modes when the IC is in operation.

Figure 2:
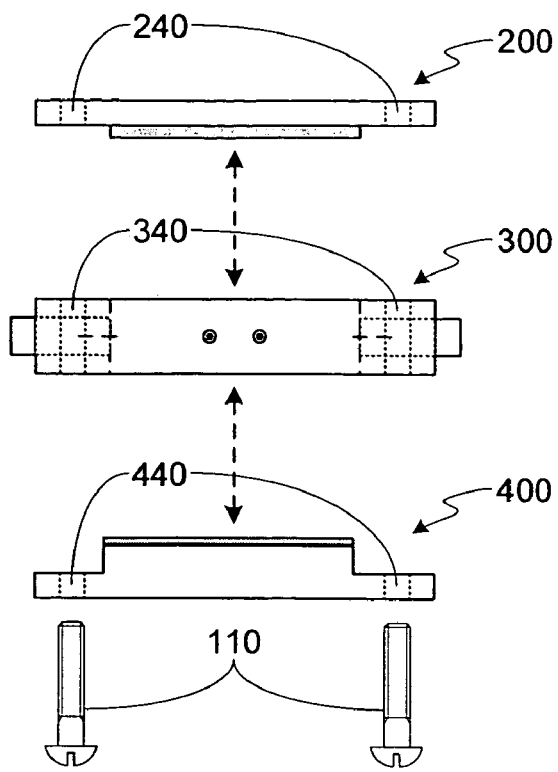
FIG. 2 is a schematic diagram showing the assembly of the three IC housing component parts shown in FIG. 1.

With reference to FIG. 2, in a method of assembly of an IC housing 100 as disclosed herein, the IC (which may be an InP IC) is first attached to the metallic base pedestal 420 with filled vias on the substrate 430 using, e.g., highly conductive Ag-based paste. RF and DC connections are next completed with, e.g., gold ribbons and wires. The substrate 430 is then mounted on the base pedestal 420 with high conductivity indium, ablestik™ material, or other practicable material as known to those skilled in the art.

The base 400 is next aligned with the main housing 300 and with the top cover 200 such that the openings 440, 340, 240 extending therethrough are axially aligned to receive fasteners 110 therein. The fasteners 110 may be threaded, or any other type of practicable fastener as may be known and selected by those skilled in the art. The fasteners are then inserted into the openings 440, 340, 240 to detachably secure the three components parts 400, 300, 200 together to form the IC housing 100 disclosed herein, as illustrated in FIG. 3.

Figure 4:
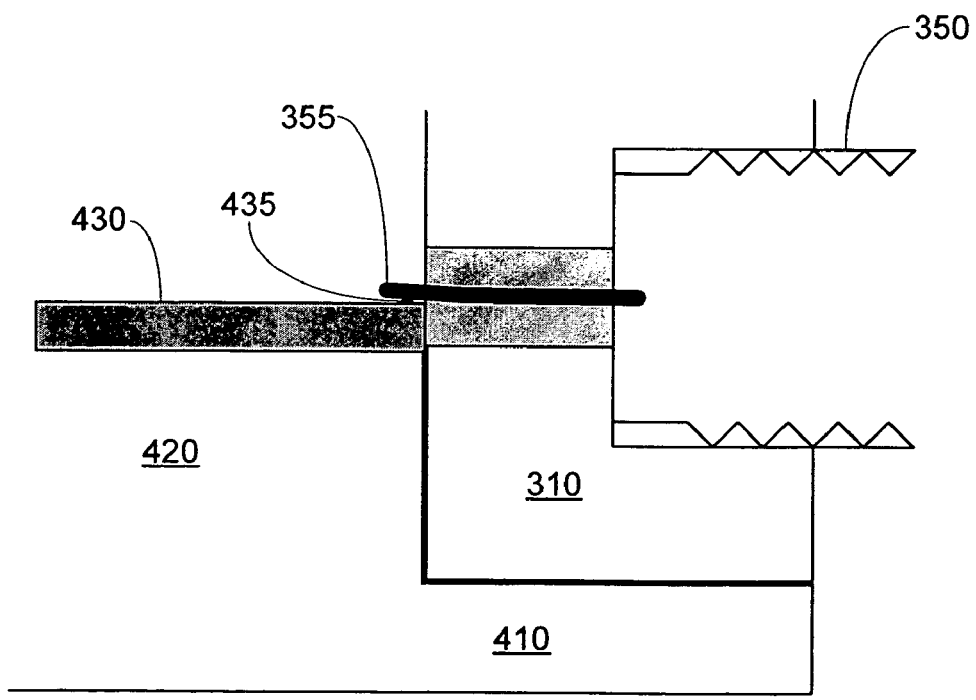
FIG. 4 is an enlarged detail of the assembled IC housing shown in FIG. 3.

With continued reference to FIG. 2, the base 400 must be orientated such that the IC mounted to the base pedestal 420 will connect with the connectors 350, 360 as required by IC design and operation. In this manner, as illustrated in FIG. 4, conductive traces or microstrip conductors 435 on the IC substrate 430 come in contact with the RF connector pins 355 and impose a predetermined spring load upon the pins to ensure a good, stable connection between the pins and the microstrips. Indium may optionally be applied to further ensure a good contact, but it is not required. As will be appreciated, because this connection is maintained only by the assembly of the base 400 to the main housing 300, removal of the IC can be quickly and safely precipitated by simply disengaging the base from the main housing and removing the base therefrom. In this manner, the IC housing embodiments described herein allow the quick, easy, and safe removal and replacement of the IC while avoiding the need to disturb the delicate and expensive RF connectors 350. Furthermore, with proper design, the housing 100 may accommodate any required number of differential ports or connectors 350, 360 in any desired configuration. The base 400 can accommodate a wide variety of IC and substrate configurations, including flip-chip ICs.

Also disclosed herein is a new multi-metal layer substrate fabrication technique compatible with most of the mm-wave high-performance substrates like ceramics, AlN, quartz, high-resistivity Si, etc. Substrate vias, dielectrics and multiple metal layer may be used to design and develop a quasi-coaxial connector with desired impedance, low-loss and ultra-broadband characteristics. Dielectric bridges connecting the grounds of the developed coplanar/quasi-coaxial patterns would be designed to help eliminate the radiation and parasitic cavity modes inside the compact housing 100. Grounded substrate vias arranged around the signal lines would reduce unwanted cross-talk between different signals.

Figure 5:
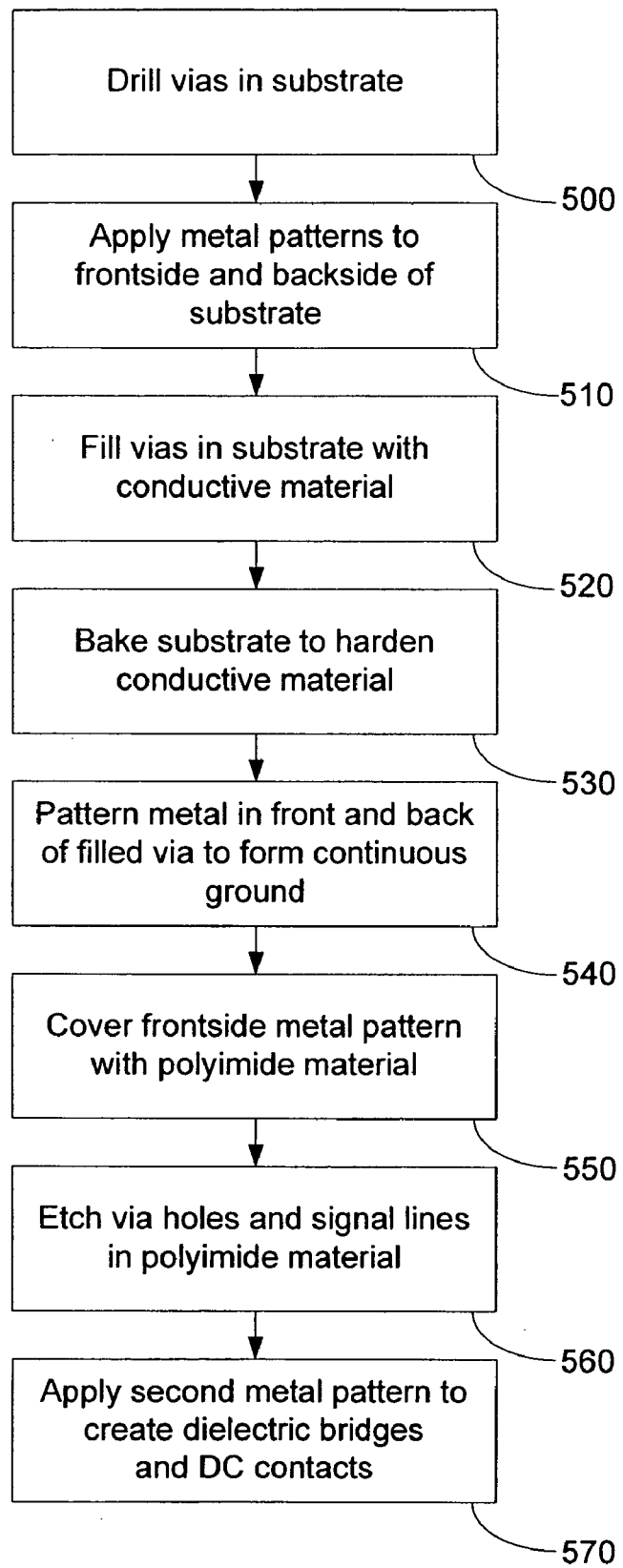
FIG. 5 is a flowchart of a method as disclosed herein.
Figure 6:
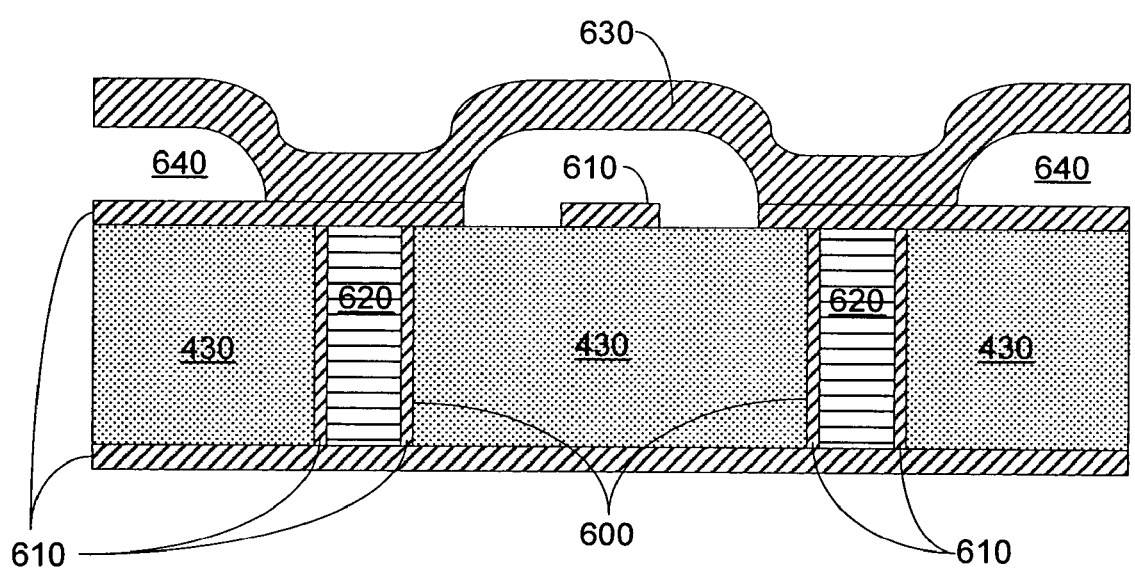
FIG. 6 is a schematic diagram of an IC mounted to a substrate according to the method of the flowchart of FIG. 5.

With reference to FIG. 5 and FIG. 6, the substrate fabrication process starts with drilling 500 the substrate 430, such as by laser drilling, using the 1st level of a designed mask set to form vias 600 therein. Plated metal patterns 610 are then created 510 in front and backside of the substrate 430, during which process the substrate vias 600 are covered with plated metallization 610 such as Ti/Au (at, e.g., 4 µm). The holes are then filled 520 with high conductivity silver-based material 620 and baked 530 at 100° C. to harden the Ag-based material. To ensure good grounding through the vias 600, the front and back of the filled vias are then metallized 540. The frontside metallization pattern 610 is then covered 550 by a thick (e.g. 6–20 µm) high performance polyimide material layer 640, such as a polyimide material having a dielectric constant of approximately 3 and a loss tangent of approximately 0.0003. Via holes are next etched 560 in the polyimide and a second metallization (e.g. Ti/Au) layer 630 is patterned 570 by lift-off to create dielectric bridges and DC contacts. Signal lines are also formed near the connector contact and IC contact area during the polyimide etching 560. The metal bridges over polyimide and substrate vias through the ground around the signal lines create a near-coaxial structure with a propagation characteristic close to TEM mode. To reduce the cost of fabrication, large-area (e.g. 3") high-resistivity substrates (e.g. silicon or high-grade alumina substrates) may be employed in batch processing, wherein the above processing method is applied to such a large-area substrate and the processed substrate is then cut into smaller, individual ICs and mounted in a housing 100 as described herein.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

What is claimed is:

1. A housing for an integrated circuit, comprising:
   a base for securing a substrate with an integrated circuit thereon;
   a top cover; and
   a body with a cavity for receiving the substrate and at least a portion of the top cover therein to form an enclosed housing therewith, the body including at least one connector extending from within the cavity to outside of the body and configured to physically contact the integrated circuit when the substrate is in the cavity.

2. The housing of claim 1, wherein any one or more of the base, the body, and the top cover comprise a metal.

3. The housing of claim 1, wherein the at least one connector is an RF connector.

4. The housing of claim 1, wherein the at least one connector is a DC connector.

5. The housing of claim 1, wherein each of the base, the body, and the top cover further comprise one or more openings for receiving fasteners therein to secure the base, the body, and the top cover together to form the enclosed housing.

6. The housing of claim 5, further comprising:
   one or more fasteners configured to be received in the openings and thereby secure the base, the body, and the top cover together to form the enclosed housing.

7. The housing of claim 1, wherein the top cover further comprises:
   an absorber formed of a material that absorbs radio frequency energy, the absorber configured to be received into the cavity when the base, the body, and the top cover are secured together.

8. The housing of claim 1, further comprising:
   an integrated circuit mounted onto the base to be received in the cavity and contact the at least one connector when the base, the body, and the top cover are secured together.

9. The housing of claim 8, wherein the integrated circuit is a monolithic microwave integrated circuit.

10. The housing of claim 8, wherein the integrated circuit is secured to the base with indium.

11. A method for forming a housing for an integrated circuit, comprising:
   providing a base for securing a substrate with an integrated circuit thereon;
   providing a top cover; and
   providing a body with a cavity for receiving the substrate and at least a portion of the top cover therein to form an enclosed housing therewith, the body including at least one connector extending from within the cavity to outside of the body and configured to physically contact the integrated circuit when the substrate is in the cavity.

12. The method of claim 11, wherein any one or more of the base, the body, and the top cover comprise a metal.

13. The method of claim 11, wherein the at least one connector is an RF connector.

14. The method of claim 11, wherein the at least one connector is a DC connector.

15. The method of claim 11, wherein each of the base, the body, and the top cover further comprise one or more openings for receiving fasteners therein to secure the base, the body, and the top cover together to form the enclosed housing.

16. The method of claim 15, further comprising:
providing one or more fasteners configured to be received in the openings and thereby secure the base, the body, and the top cover together to form the enclosed housing.

17. The method of claim 16, further comprising:
securing the base, the body, and the top cover together with the one or more fasteners to form the enclosed housing.

18. The method of claim 11, wherein the top cover further comprises:
an absorber formed of a material that absorbs radio frequency energy, the absorber configured to be received into the cavity when the base, the body, and the top cover are secured together.

19. The method of claim 11, further comprising:
mounting an integrated circuit onto the base so as to be received in the cavity and contact the at least one connector when the base, the body, and the top cover are secured together.

20. The method of claim 19, wherein the integrated circuit is a monolithic microwave integrated circuit.

* * * * *